(12) United States Patent
Pylant et al.

(10) Patent No.: US 7,613,963 B1
(45) Date of Patent: Nov. 3, 2009

(54) WIRELESS METHOD AND APPARATUS FOR TESTING ARMAMENT CIRCUITS

(75) Inventors: Chris D. Pylant, Arlington, TX (US); Andrew W. Stell, Allen, TX (US); John D. Wetters, Fort Worth, TX (US)

(73) Assignee: Williams-Pyro, Pnc., Fort Worth, TX (US)

( * ) Notice: Subject to any disclaimer, the term of this patent is extended or adjusted under 35 U.S.C. 154(b) by 731 days.

(21) Appl. No.: 11/311,831

(22) Filed: Dec. 19, 2005

Related U.S. Application Data

(60) Provisional application No. 60/637,677, filed on Dec. 20, 2004.

(51) Int. Cl.
  *G01R 31/28* (2006.01)
  *G01R 31/02* (2006.01)
  *B64D 1/04* (2006.01)
  *G01R 27/28* (2006.01)

(52) U.S. Cl. .......................... 714/724; 324/72; 89/1.1; 702/118

(58) Field of Classification Search ......... 714/724–727, 714/733, 734, 742, 703, 799; 102/419, 420; 701/31, 115; 73/167; 89/1.1; 324/537, 72, 324/426, 555, 538; 702/108, 117, 118, 121; 340/945
See application file for complete search history.

(56) References Cited

U.S. PATENT DOCUMENTS

| | | | | |
|---|---|---|---|---|
| 3,921,067 A | * | 11/1975 | Mernone | 324/72 |
| 4,726,224 A | * | 2/1988 | D'Ausilio | 73/167 |
| 5,790,551 A | | 8/1998 | Chan | |
| 6,269,319 B1 | * | 7/2001 | Neisch et al. | 702/118 |
| 6,389,558 B1 | * | 5/2002 | Herrmann et al. | 714/39 |
| 6,561,071 B1 | * | 5/2003 | Norton et al. | 89/1.1 |
| 2005/0162172 A1 | * | 7/2005 | Bertness | 324/426 |

* cited by examiner

*Primary Examiner*—Phung M Chung
(74) *Attorney, Agent, or Firm*—Morani Patent Law P.C.

(57) ABSTRACT

The testing apparatus of the present invention provides a self-contained test module that connects to the weapons firing circuit on the weapons platform. This test module communicates with a data collector and controller that is carried by a technician or operator. The communication link between the test module and the data collector and controller is wireless so that the technician can move about without interference from the cable. The test module, which contains a digital voltage detector, is more accurate than prior analog voltage detectors. The test module connects to different connectors, allowing for a reduction of equipment needed in the testing apparatus and providing a significant savings in weight. The data collector and controller stores test data of a particular circuit over a period of time and performs analysis on that test data to identify upcoming or potential problems so that repair can be made before operational readiness is compromised by a circuit failure.

15 Claims, 6 Drawing Sheets

WIRELESS METHOD AND APPARATUS FOR TESTING ARMAMENT CIRCUITS

This application claims the benefit of U.S. provisional patent application Ser. No. 60/637,677, filed Dec. 20, 2004.

FIELD OF THE INVENTION

The present invention relates to methods and apparatuses for circuits such as might be found on an aircraft or other weapons systems platforms.

BACKGROUND OF THE INVENTION

There are many kinds of weapons. For example, weapons include bombs, rockets and missiles. Weapons are fired from, or launched from, weapons platforms. One type of weapons platform is an aircraft. Another type of platform is a vehicle or a rocket or missile launcher.

Both weapons and weapons platforms have electrical circuits. The electrical circuits perform a variety of functions such as firing the weapons. For example, an aircraft may be loaded with rockets. When the aircraft is on the ground, the rockets are disarmed and safed, so as to prevent accidental firing. In flight and after a target has been identified, the pilot or weapons officer fires one or more rockets electrically. A common firing mechanism involves providing electrical current to an igniter, which igniter initiates the rocket propulsion system.

The individual weapons are electrically connected to the platform circuits by way of connectors.

The weapons systems circuits on platforms are checked to insure safe and reliable operation. Safe operation insures that a weapon will not accidentally fire unless and until the weapon is pointed at a target. Reliable operation insures that once properly aimed and fired, the weapon will release and fire as intended.

Prior art weapons circuits test systems for aircraft utilize an analog voltage detector and a kit of various connectors and test cables. The appropriate connector is selected and coupled to the aircraft connector. The appropriate test cable extends between the test connector and the voltage detector. The test systems test for: 1) stray voltage on the aircraft weapons circuit (to prevent accidental firing); 2) presence of voltage on the aircraft weapons circuit (to insure sufficient voltage for firing); 3) electro-explosive device load test (to insure sufficient current for firing); 4) continuity in the weapons circuit; and 5) a self test of the test circuit.

One problem with the prior art test system is the difficulty of use. Two technicians are required to test aircraft weapons circuits. One technician is on the ground, operating the voltage detector, while the other technician is in the aircraft cockpit, exercising weapons circuit controls. Also, the prior art test kit is bulky and heavy, being incorporated into a box, having a total weight of about 70 pounds. Many connectors are required to connect to the different aircraft connectors and many cable links are required to connect the various connectors with the voltage detector. Furtherstill, the analog voltage detector relies on trim potentiometers to null analog voltage offsets. Achieving the proper trim settings can be difficult and requires frequent checking. Infrequent checking results in inaccurate measurements. Still another problem is that some of the prior art test connectors incorporate mechanical rotary switches that require multiple switch positions in order to allow testing of multiple connections. However, human error in making the proper switch settings can occur.

SUMMARY OF THE INVENTION

It is an object of the present invention to improve upon the testing apparatus of the prior art.

The present invention provides an apparatus for testing an armament circuit, which comprises at least one connector, a test module and a data collector and controller. The connector is structured and arranged to electrically connect to the armament circuit. The test module is coupled to the connector. The test module comprises a testing circuit, the testing circuit testing the armament circuit when the connector is connected to the armament circuit. The testing circuit comprises a controller and a first communications circuit. The data collector and controller comprises a second communications circuit. The first and second communications circuit communicate over a wireless link. The data collector and controller sends test instructions to the test module over the link and the test module sends test data from the armament circuit over the link.

In one aspect of the present invention, the testing circuit comprises a digital circuit that tests for stray voltages.

In another aspect of the present invention, the testing circuit comprises a digital circuit that tests for presence of voltage.

In another aspect of the present invention, the testing circuit comprises a circuit that tests for sufficient firing current.

In another aspect of the present invention, the testing circuit comprises a circuit that tests for continuity.

In another aspect of the present invention, the test module comprises at least two testing circuits and the data collector and controller sends test instructions to use the testing circuits to the test module over the link.

In another aspect of the present invention, the data collector and controller provides prompts to a technician to exercise the armament circuit during the operation of the testing circuit.

In another aspect of the present invention, there are at least two connectors, with each connector having a different end that connects to a different armament circuit. The test module is removably coupled to each one of the connectors.

In another aspect of the present invention, the data collector and controller determines if the armament circuit passes or fails the testing by comparing the test data to stored testing values.

In another aspect of the present invention, the data collector and controller determines trending of the armament circuit by comparing the test data to historical test data for the same armament circuit and if the test results are within a predetermined range of test results provides prompts to a technician to take corrective action.

The present invention also provides an apparatus for testing at least two armament circuits that comprises at least two connectors. Each of the connectors having a first end and a second end. The first end of each connector structured and arranged to electrically connect to one of the respective armament circuits. The first ends are different. Each of the connectors having a second end that are the same. A test module is structured and arranged to be coupled to the second ends of the connectors. The test module comprises a testing circuit, the testing circuit testing the respective armament circuit when the respective connector is connected to the armament circuit. The testing circuit comprising a controller and a first communications circuit. A data collector and controller comprises a second communications circuit. The first and second communications circuit communicating with each other. The data collector and controller sending test instructions to the test module over the link and the test module sending test data form the armament circuit over the link.

The present invention also provides a method of testing an armament circuit. A connector is provided that can electrically couple to the armament circuit. A test module is connected to the connector. A wireless communications link is established between the test module and a data collector and controller. An instruction is sent from the data collector and controller over the link to the test module to test the armament circuit. The armament circuit is tested with the test module and the results of the test are provided to the data collector and controller over the link.

In another aspect of the present invention, the step of testing the armament circuit further comprises the step of testing for stray voltages.

In another aspect of the present invention, the step of testing the armament circuit further comprises the step of testing for the presence of voltage.

In another aspect of the present invention, the step of testing the armament circuit further comprises the step of testing for sufficient firing current.

In another aspect of the present invention, the step of testing the armament circuit further comprises the step of testing for continuity.

In another aspect of the present invention, the method further comprises the step of determining trending of the armament circuit by comparing the test data to historical test data from the same armament circuit and if the test results are within a predetermined range of test results then providing a prompt to a technician to take corrective action.

In another aspect of the present invention, the method further comprises the step of disconnecting the test module from the connector and reconnecting the test module to a second connector that can connect to a second armament circuit.

The testing apparatus of the present invention provides a self-contained test module that connects to the weapons firing circuit on the weapons platform. This test module communicates with a data collector and controller that is carried by a technician or operator. The communication link between the test module and the data collector and controller is wireless so that the technician can move about without interference from the cable. The test module, which contains a digital voltage detector, is more accurate than prior analog voltage detectors. The test module connects to different connectors, allowing for a reduction of equipment needed in the testing apparatus and providing a significant savings in weight. The data collector and controller stores test data of a particular circuit over a period of time and performs analysis on that test data to identify upcoming or potential problems so that repair can be made before operational readiness is compromised by a circuit failure.

DESCRIPTION OF THE PREFERRED EMBODIMENT

Figure 1:
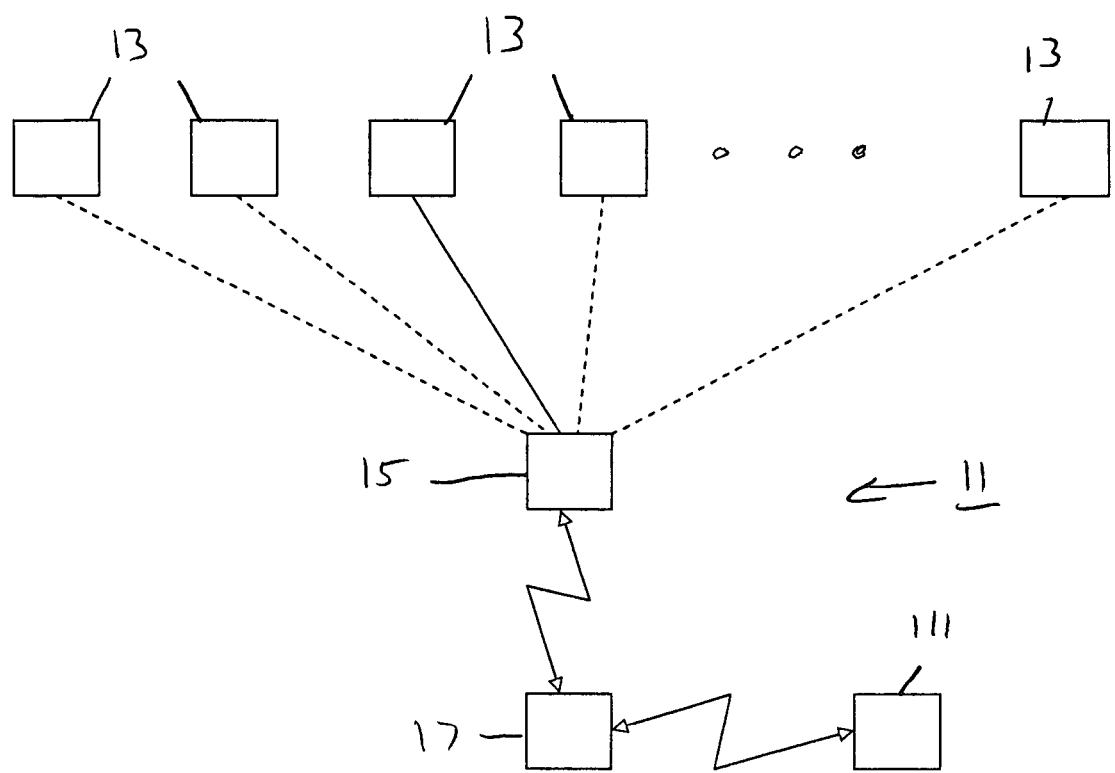
FIG. 1 is a block diagram of the testing apparatus of the present invention, in accordance with a preferred embodiment, as used in conjunction with a circuit under test.
Figure 7:
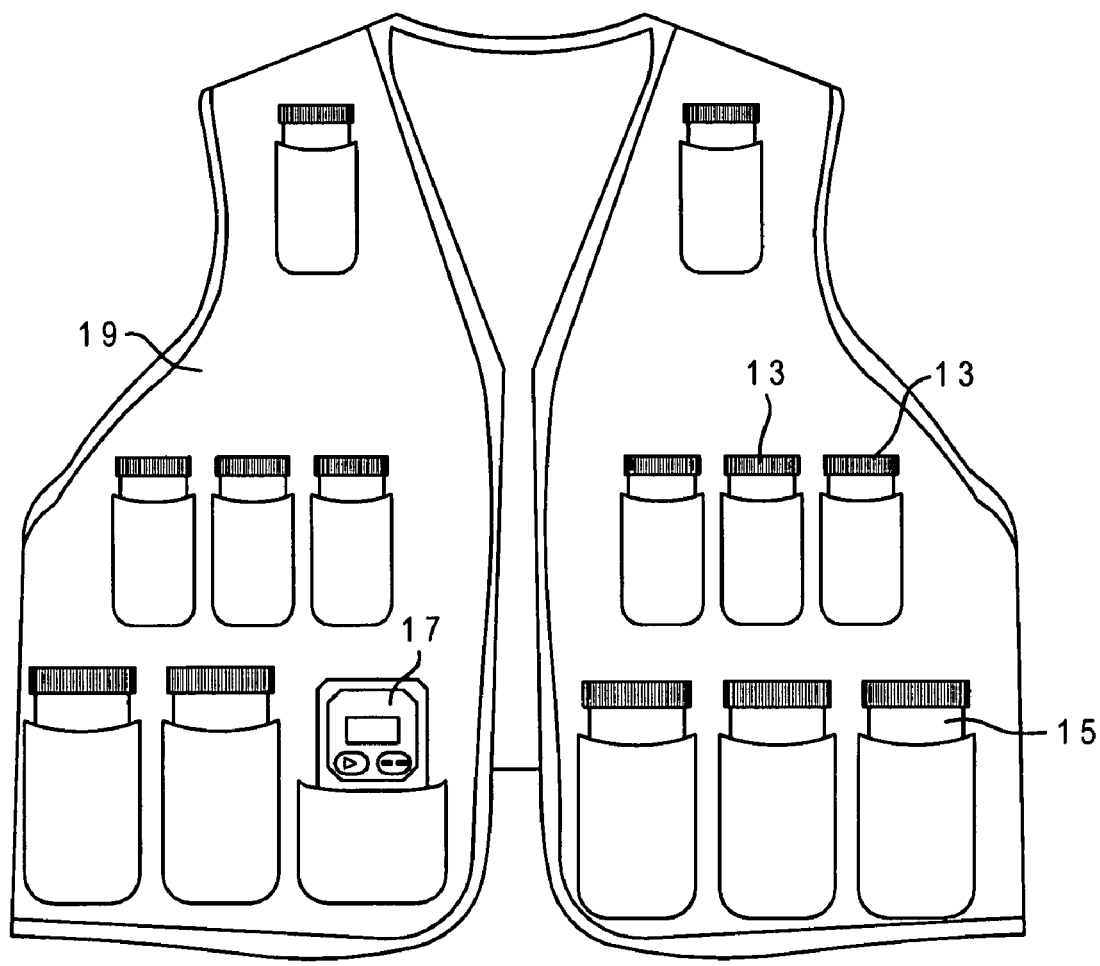
FIG. 7 is a diagram illustrating a vest that carries the testing apparatus.

The testing apparatus 11 of the present invention is shown in kit form in FIGS. 1 and 7. The testing apparatus 11 includes connectors 13, a test module 15 and a data collector and controller 17.

The testing apparatus 11 has a number of connectors 13, typically one connector for each type of connector found on the weapons platform. Weapons platforms include aircraft, vehicles, rocket and missile launchers, etc. Weapons platforms contain or hold weapons. The weapons are fired or launched from the platform. In the description that follows, the example weapons platform that is described will be an aircraft.

The testing apparatus 11 also has one or more test modules 15. The test module 15 is removably connected to the connectors 13. A single test module 15 can be connected to each one of the connectors. Alternatively, several test modules can be provided, which test modules are identical (that is to provide a spare) or designed to couple to specific connectors.

The testing apparatus 11 also has a data collector and controller 17, which is small and portable.

The testing apparatus 11 is small and light enough to be carried in a vest 19 (see FIG. 7) worn by a technician. The vest has pockets for holding the various connectors 13, the test module 15 and the data collector and controller 17. To use the testing apparatus, the technician, who is on the ground beside the aircraft, connects one of the connectors to the aircraft. The test module 15 is connected to the connector 13. The technician then climbs into the aircraft cockpit and, using the data collector and controller 17, establishes a wireless communication link to the test module 15. Once the devices are communicating with each other, the technician exercises the weapons systems' electrical circuit in the aircraft and the test module 15 performs the testing. Results of the testing are communicated from the test module 15 to the data collector and controller 17. The data collector and controller 17 determines if the aircraft circuit has passed the test and records the test results in memory.

The data collection and controller 17 contains historical test results. That is to say that a record of test results for that particular aircraft and that particular circuit are recorded for some period of time such as several months or years. The data collector and controller 17 performs an analysis on the recorded test results to determine potential performance problems. Such problems can be addressed by maintenance and repair to the circuit before the problem adversely denigrates circuit performance.

The individual components of the testing apparatus 11 will now be discussed.

Figure 2:
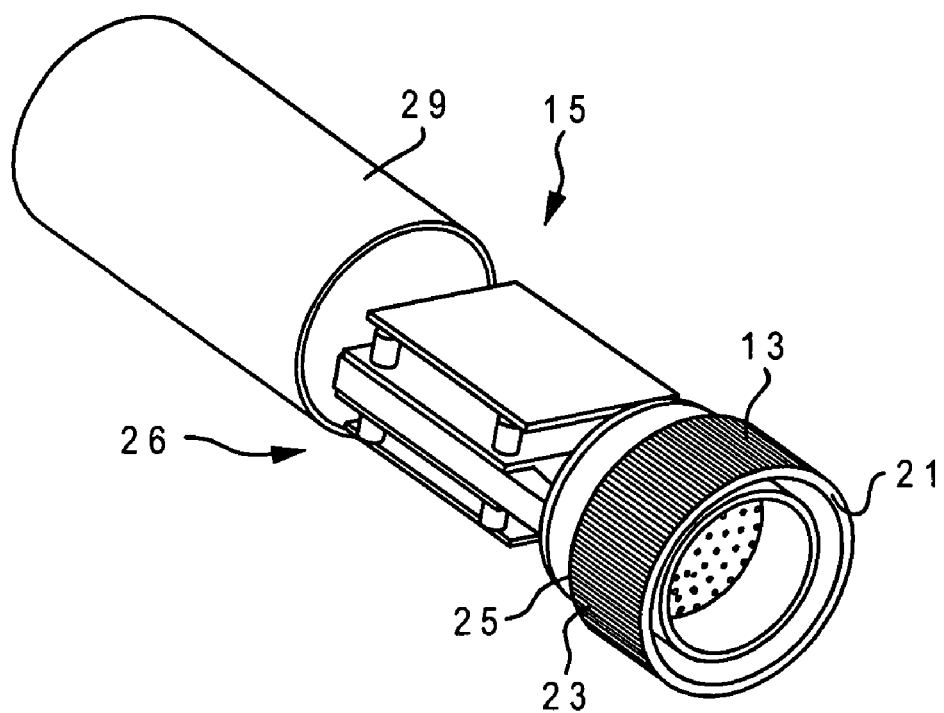
FIG. 2 is an exploded view of a test module and connector.
Figure 3:
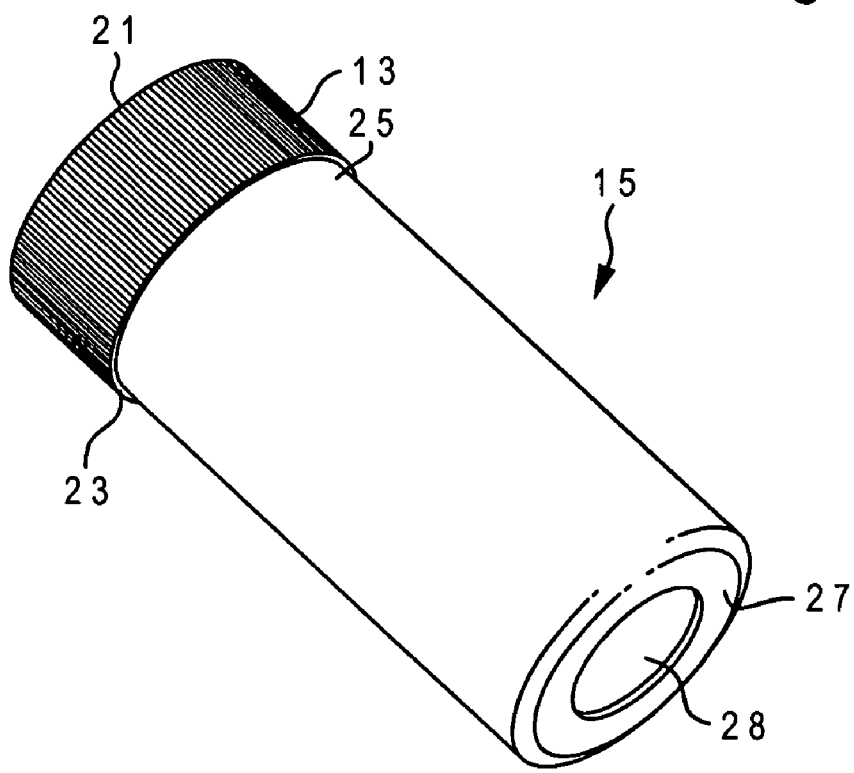
FIG. 3 is a rear view of the test module and connector of FIG. 2.

Referring to FIGS. 2 and 3, each connector 13 has an aircraft end 21 and a test module end 23. The aircraft end 21 of each connector is unique to the particular type of aircraft connector that is to be coupled to. Aircraft connectors vary by diameter, number of electrical pins and so on. The test module end 23 of all of the connectors are identical so as to allow a single test module 15 to be used. Of course, the invention is not limited to a single test module. A testing apparatus could have two or more test modules, which are either identical (for example one could be a spare) or different.

The test module 15 also has two ends. One end is a connector end 25, that couples to the respective connector 13. The coupling between the connector 13 and the test module 15 can be a standard electrical coupling. This coupling is the same from connector to connector, to allow the interconnection of a test module to the various connectors, and from test module to test module, to allow the interconnection, or interchangeability, of several test modules to the same connector. The other end is a communications end 27 that communicates with the data connector and controller 17. The electrical circuitry 26 of the test module is contained in a housing 29. In one embodiment, when the communications link between the test module 15 and the data collector and controller 17 is infrared, the housing has a port 28 that is transparent to infrared.

Figure 4:
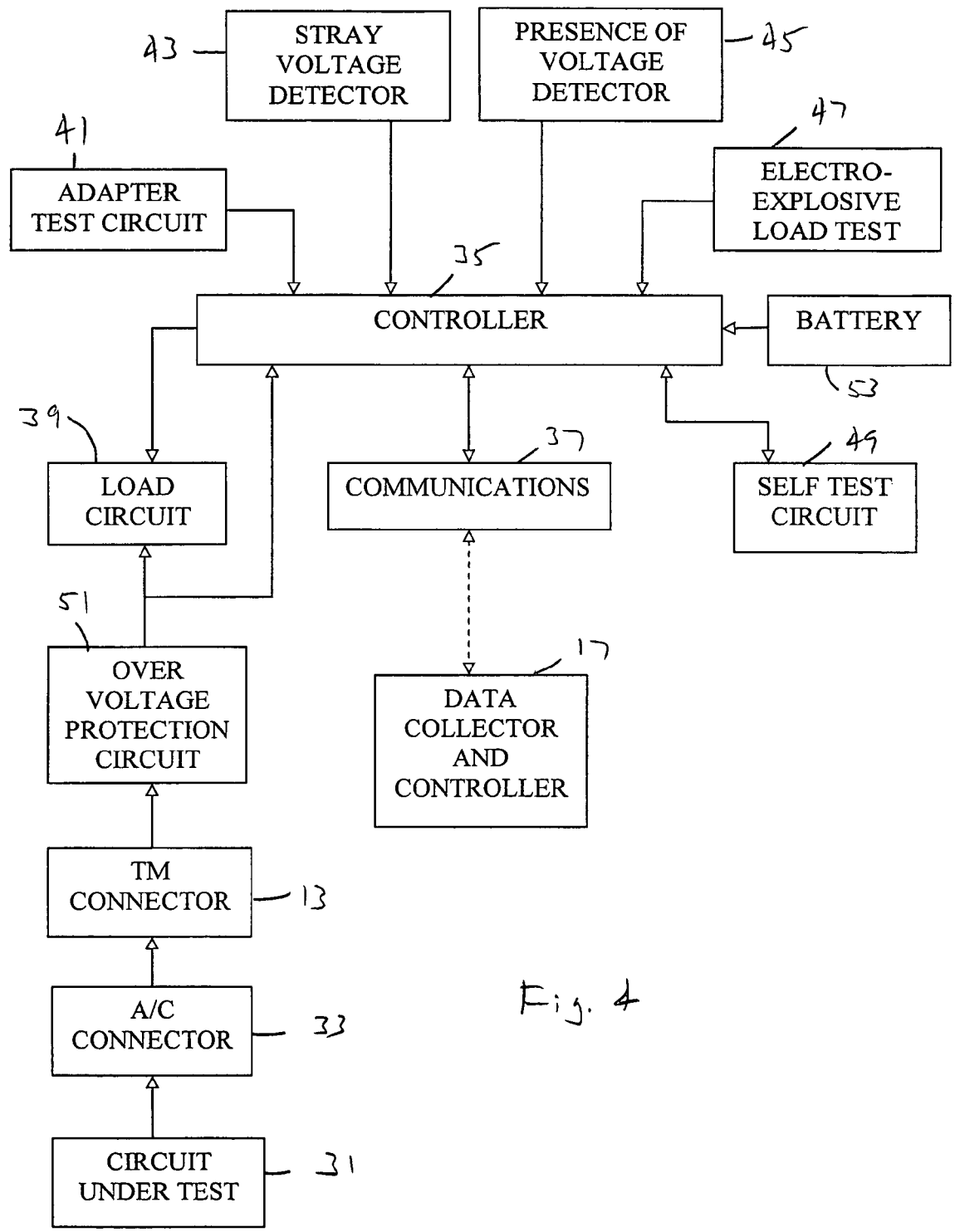
FIG. 4 is a block diagram of the test module, as used with the circuit under test and data collector and controller.

FIG. 4 is a block diagram of the testing apparatus 11, as well as the circuit under test. The testing apparatus 11 connects to an aircraft weapons firing circuit 31 (the circuit under test) by way of the associated aircraft connector 33. The testing apparatus connector 13 (TM or test module connector) connects to the aircraft connector.

In general, the test module 15 has testing circuits, a controller 35 and a communications circuit 37. The testing circuits interface with the aircraft circuit 31. The controller 35 controls the testing and also communicates with the data collector and controller 17. The communications circuit 37 communicates with the data collector and controller.

There are several testing circuits, namely a load circuit 39, an adapter test circuit 41, a stray voltage test circuit 43, a presence of voltage detector 45 and an electro-explosive device (EED) load test circuit 47. In addition, a self-test circuit 49 is provided.

The load circuit 39 provides a dummy load across the aircraft circuit 31. The load simulates the resistance of a weapon that would be connected to the aircraft circuit 31. As an example, in the preferred embodiment, the load is 3 ohms. The load circuit could have more than one load. For example, one aircraft circuit may require a first load, while another aircraft circuit could require a second, or higher, load. The controller 35 selects, in the load circuit, the particular load needed for the particular aircraft circuit.

The adapter test circuit 41 determines continuity of the connection between the test module circuits, the connector 13 and the aircraft circuit 31.

The stray voltage detector 43 measures the stray voltage across the loaded aircraft circuit 39, 31. Such stray voltages may be induced onto the aircraft circuit by other circuits on the aircraft or by external sources. The aircraft circuits are typically shielded to minimize any electromagnetic interference (EMI). In the preferred embodiment, the stray voltage should be less than 120 mVrms for a 3 ohm load.

The presence of voltage detector 45 measures the voltage used to fire the weapon. The technician, or operator, in the aircraft cockpit fires the aircraft circuit to provide a "fire" voltage across the load. This "fire" voltage is measured by the detector 45.

Both the stray voltage detector 43 and the presence of voltage detector 45 are digital voltage detectors and are controller based. Digital voltage detectors are conventional and commercially available. The advantage to using digital voltage detectors in a field environment such as aircraft testing is that in-field calibration is not needed. With the prior art analog voltage detectors, the operational amplifier circuits had to be periodically calibrated to null offset voltages that resulted from temperature fluctuations and manufacturing tolerances. With the digital voltage detectors, the accuracy is much improved.

The EED load test circuit 47 measures the current used to fire the weapon. The technician in the aircraft cockpit fires the aircraft circuit to produce a current through the load 39, which current is then measured by the test circuit 47.

The controller 35 is a conventional, commercially available microprocessor or microcontroller. Adequate memory (both nonvolatile such as ROM, and volatile such as RAM) is provided. All of the test circuits 39, 41, 43, 45, 47, 49 and the communications circuit 37 are connected to the controller 35.

An overvoltage protection circuit 51 is provided between the aircraft circuit 31 and the other circuits in the test module. The overvoltage protection circuit 51 is also connected to the controller 35. In addition, a battery 53 is provided. This makes the test module totally self-contained. The battery can be rechargeable. The self-test circuit 49 checks the battery 53.

The communications circuit 37 provides wireless communications, such as by infrared (IR) or radio frequency (rf). If by IR, a window 28 or lens is provided, typically in the housing. If by rf, then an antenna is provided. The communications circuit permits two-way communication between the test module 15 and the data collector and controller 17. Various infrared and radio frequency communication protocols exist. For example, for rf, Wi-Fi (wireless fidelity) can be used.

The test module 15 includes all components shown in FIG. 4, except the data collector and controller 17, the connectors 13, 33 and the aircraft circuit 31.

Figure 5:
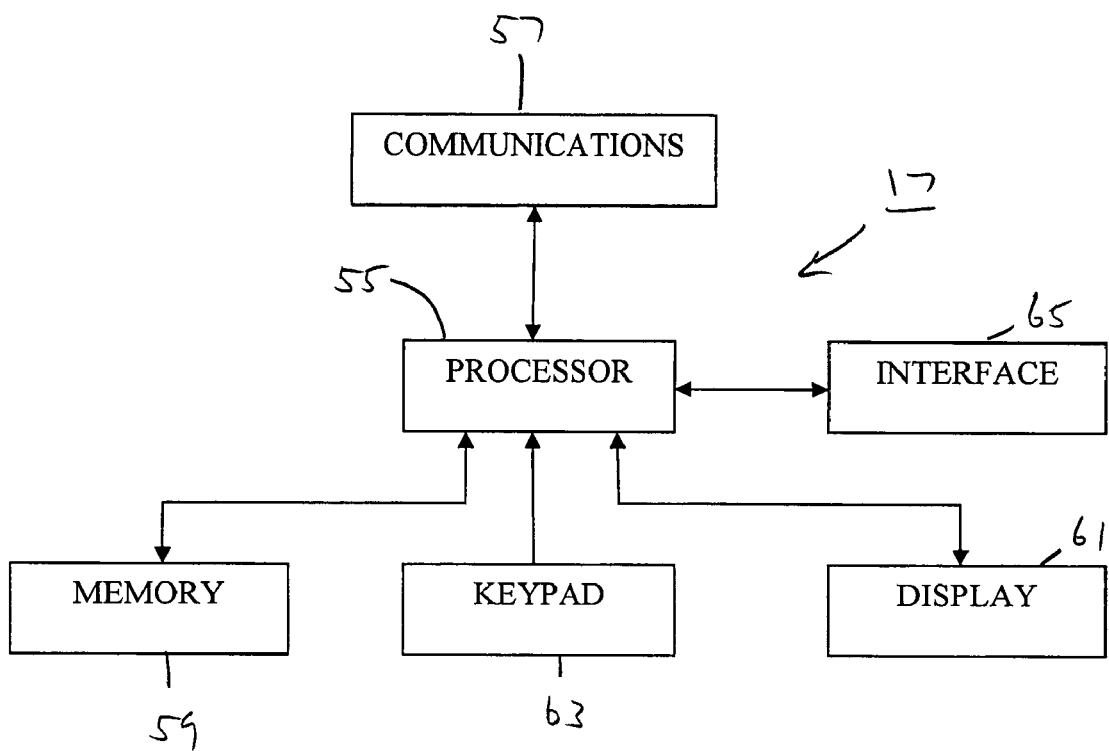
FIG. 5 is a block diagram of the data collector and controller.

The data collector and controller 17 is, in the preferred embodiment, a personal digital assistant (PDA) which is conventional and commercially available. Such PDA's are available through companies such as Palm. FIG. 5 shows a block diagram of the data collector and controller 17. A microprocessor 55 forms the core. Various peripheral devices connect to the processor. The peripheral devices include a wireless communications device 57, memory 59 (which may have both nonvolatile and volatile memory), a display 61 and a keypad 63 or other input device. In some PDA's, portions of the display screen are enabled to receive input from a stylus pressing on the display screen. An interface device 65 is also provided so that the data collector and controller can connect to a host computer. The wireless communications device 57 can communicate with the communications circuit 37 of the test module 15.

Figure 6:
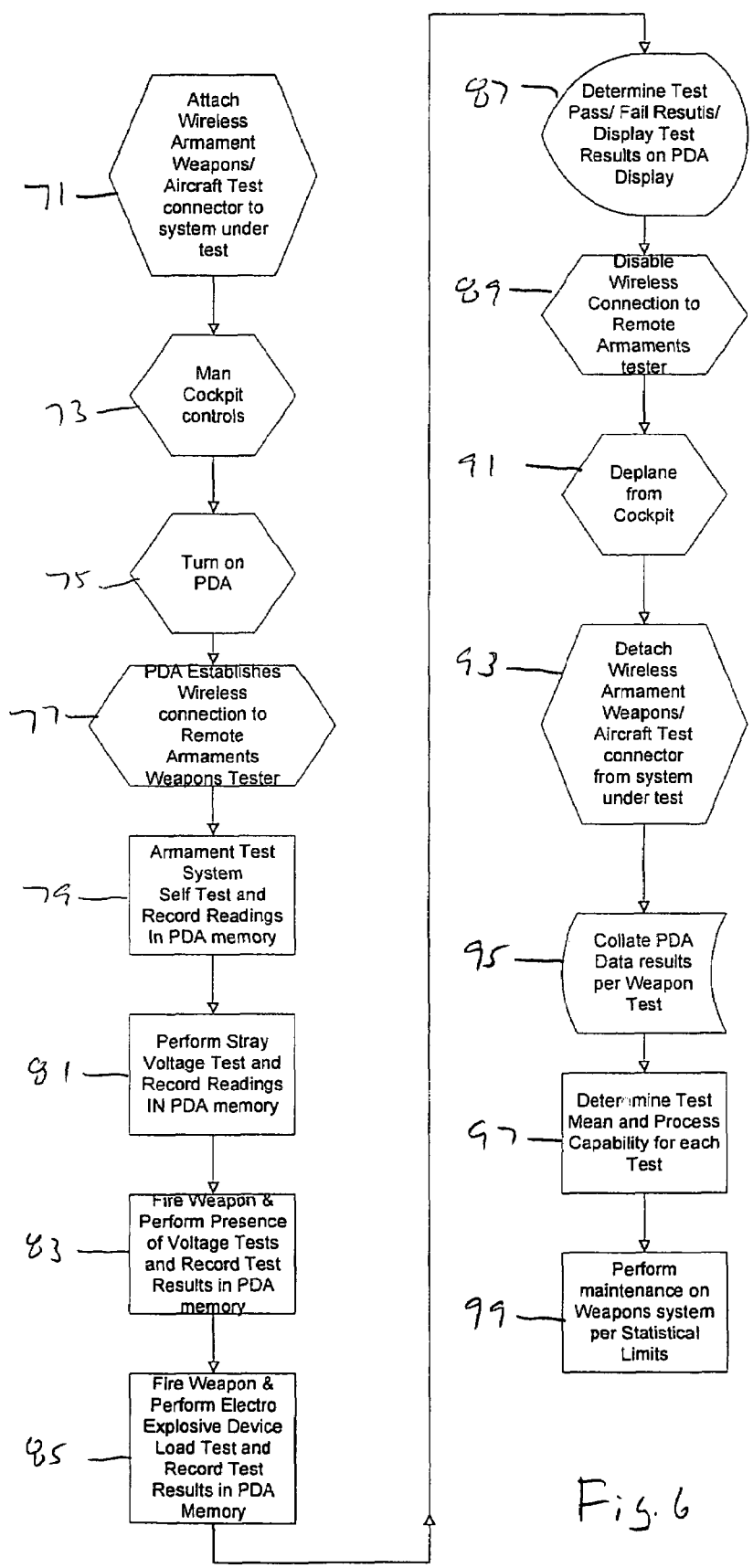
FIG. 6 is a flow chart illustrating the test procedure performed when using the testing apparatus.

The operation of the testing apparatus will now be described, with reference to FIG. 6. The first few steps involve preparation for the test. In step 71, the test module 15 and appropriate connector 13 (see FIG. 4) are attached to an aircraft connector 33 so as to access the circuit 31 to be tested. On an aircraft, the connector 33 is typically located on a wing, such as a pylon, or on the outside of the fuselage. The technician then mans the controls for the circuit 31 to be tested, step 73. In an aircraft, these controls are located in the cockpit, so the technician enters the cockpit. The data collector and controller 17 (such as a PDA) is turned on, step 75, and a wireless communication link 38 (see FIGS. 1 and 9) is established between the test module 15 and the data collector and controller 17, step 77. The communications link 38 is two way. In general, data moves from the test module 15 to the data collector and controller 17, while instructions move from the data collector and controller to the test module. The data collector and controller 17 could already be turned on and the technician could simply command the data connector and controller to establish the communications link. Also, the communications link could be established before the technician enters the cockpit, such as right after attaching the test module and its connector to the aircraft. If the wireless communication link is infrared, then the data collector and controller and the test module should be within a line of sight of each other. The technician enters identifying information into the data collector and controller 17, such as the type of aircraft, the identification information for the aircraft and the particular weapons circuit being tested. Note that although this description discusses only one technician conducting the entire test, two technicians could be utilized. For example, one technician can stay in the cockpit, while the other technician moves the test module from one aircraft connector to another aircraft connector between testing.

Over the next few steps, the actual testing occurs. In step 79, a self-test occurs, with the self-test circuit 49 (see FIG. 4)

checking the battery 53. In addition, the adapter test circuit 41 tests the continuity of the connection with the aircraft circuit 31 (see FIG. 4). The test module measurements are transmitted to the data collector and controller 17 and stored in memory 59 (See FIG. 5). Referring back to FIG. 6, in step 81, the stray voltage detector 43 (FIG. 4) performs its test and the measurements are communicated to the data collector and controller 17 and stored in memory 59. This test may require the technicians to operate various cockpit equipment, such as radio transmitters, radar units, etc.

The technician then operates the aircraft circuit 31 to fire the weapon (of course, there is no weapon attached to the circuit 31 during testing). In step 83, the presence of voltage detector circuit 45 measures the voltage across the circuit. The test measurements are communicated to the data collector and controller 17 and stored in memory 59. The technician operates the aircraft to fire the weapon again so that the EED load test circuit 47 can measure the firing current, step 85. The test measurements are communicated to the data collector and controller 17 and stored in memory 59.

During the testing procedure, the data collector and controller 17 displays prompts to the technician, such as "fire weapon". The data collector and controller 17 also instructs or commands the test module controller 35 on what circuits to operate. The instructions from the data collector and controller 17 are transmitted over the communications link 38. The data collector and controller 17 can send a single instruction to the controller 35 in the test module 15, wherein the controller 35 steps through each step of the test, exercising each test circuit 41, 43, 45, and 47. Alternatively, the data collector and controller 17 can send an instruction for the controller 35 to step to the next test circuit after the data from the previous test has been received and stored. The test module 15 and the data collector and controller 17 use standard communications protocols. The controller 35 operates like a switch and may have a memory. For example, in step 79, the data collector and controller 17 instructs the controller 35 to connect the self-test circuit to the battery 53. The controller 35 then routes the test measurements to the communications circuit 37 for uploading to the data collector and controller 17. The communications circuit 37 typically has a memory buffer for storing the information that is transmitted and received. In step 81, the controller 35 connects the stray voltage detector 43 across the load circuit 39 and routes the test measurements to the communications circuit 37 for uploading to the data collector and controller 17. If the technician needs to operate cockpit equipment, such as firing the weapon, the controller 35 connects the appropriate test circuit to the load circuit and advises the data collector and controller that the test module is ready. The data collector and controller then prompts the technician on what procedure to perform in the cockpit.

The next few steps follow the actual testing. In step 87, the data collector and controller 17 determines if the aircraft passes or fails the testing. The data collector and controller 17 contains in its memory 59 the ranges or values for the tests for each type of weapons circuit and for each type of aircraft. The processor compares each test measurement to the stored values and determines if the test passes or fails. For example, for the EED load test, the processor determines if the current measured during the test exceeds a minimum current value. If it does, the aircraft passes, if not, then the aircraft fails. The results of the test are displayed and stored.

If other circuits are to be tested, the test module 15 is attached to the next aircraft circuit. This is typically accomplished by connecting the connector 13 (see FIG. 4) to the next aircraft circuit to be tested. The tests are repeated for the next aircraft circuit. Steps 71-93 are repeated for each circuit to be tested.

If no more circuits are to be tested, then the communications link between the data collector and controller and the test module is disconnected, step 89, and the technician deplanes from the cockpit, step 91. The test module and connector are detached from the aircraft, step 93.

In the remaining steps, the test results are analyzed on an historical basis to look for trends that might portend any future operational problems. The remaining steps are performed after a number of tests have been conducted on a particular circuit 31, so that historical test data is present for that particular aircraft circuit 31. The remaining steps can also be performed on the output of more than one testing apparatus 11 for the same aircraft circuit 31.

In step 95, the test data for each weapon circuit 31 is collated. This data is then analyzed to determine the mean and process capability for each type of test (such as stray voltage), step 97. Conventional statistical process techniques are used.

This analysis is useful for predicting problems before operational readiness is impaired. For example, on the presence of voltage test, if the minimum voltage is 24 volts and the tested voltage has exhibited a downward trend, say from 30 volts, with a variance of ±1.0 volt, then maintenance can be performed on the firing circuit when the tested voltage is measured at 25 volts. The data collector and controller 17 displays a notice to the technician that a low voltage condition is going to occur in the near future. The technician then performs a maintenance or repair on the circuit, step 99.

The same analysis occurs for the other tests. For example, with the EED load test, when a measured firing circuit is within a range of a minimum value, then the data collector and controller displays a notice that action is need. Likewise, for the stray voltage test, if the measured voltage is within a range of a maximum voltage, then a maintenance or repair notice is displayed so that the technician can take corrective action. The same analysis can be performed on the self-tests for all of the testing circuits.

The data collector and controller 17 can be interfaced with a host computer 111 (see FIG. 1) to upload all of the test results and analysis into the host computer for storage. The connection between the data collector and controller 17 and the host computer 111 can be wireless (shown in FIG. 1) or wired. If wireless, then the test data can be uploaded to the host computer 111 either after each measurement or after all test measurements have been taken In addition, a paper copy of the test measurement and analyses can be made by using a printer. Likewise, a new, or second, data collector and controller can be downloaded with the previous test information and testing parameters for a particular aircraft or type of aircraft from the host computer 111.

With the present invention, the use of microcontroller based digital voltage detection circuitry improves the accuracy of measurements, because the technician no longer must trim potentiometers to calibrate the voltage detectors. Also, the testing apparatus is much lighter in weight than the prior testing apparatus, because the adapter cables between the connectors and the voltage testers are eliminated. In fact, the prior art testing apparatus uses twenty six connectors/cable assemblies this can be reduced to ten connectors and no cables. This is because some of the prior connectors/cable assemblies are redundant to provide different cable connection lengths. The adapter cables are replaced by the wireless communication link. Not only is a weight savings provided, but the test can be performed by one technician who can wear the testing apparatus in a vest. The technician with the data collector and controller can move unconstrained by a cable. The data collector and controller provides an advanced user interface that provides the test procedure on a step-by-step basis and reduces procedural error. The testing apparatus utilizes automatic switching, instead of manual switching, at the aircraft connector, and further improves reliability and reduces operator error.

The foregoing disclosure and showings made in the drawings are merely illustrative of the principles of this invention and are not to be interpreted in a limiting sense.

The invention claimed is:

1. A light weight portable system for multi-testing of an armament circuit, comprising:
   at least one connector, the connector structured and arranged to electrically connect to the armament circuit;
   a test module coupled to the connector, the test module comprising a testing circuit, the testing circuit testing the armament circuit when the connector is connected to the armament circuit on a first end and connected to the testing circuit on a second end, the testing module comprising a controller and a first communications circuit;
   a data collector and controller comprising a second communications circuit, the first and second communications circuits communicating over a wireless link, the data collector and controller sending test instructions to the test module over the link and the test module sending test data from the armament circuit over the link to the data collector and controller; and
   wherein, the data collector and controller is a portable handheld device.

2. The apparatus of claim 1 wherein the testing module comprises at least two testing circuits, wherein the at least two testing circuits comprise a first digital testing circuit that tests for stray voltages and a second testing circuit that tests for sufficient firing current.

3. The apparatus of claim 2 wherein:
   the data collector and controller sends test instructions over the wireless link for selection of one of the at least two testing circuits, the testing circuit that tests for sufficient firing current.

4. The apparatus of claim 3 wherein the data collector and controller prompts a technician to exercise the armament circuit during the operation of the testing circuit.

5. The apparatus of claim 1 wherein the testing module comprises a circuit that tests for continuity of the armament circuit and a circuit that tests for stray voltage.

6. The apparatus of claim 1, further comprising:
   at least two connectors, with each connector having a different first end that connects to a different armament circuit and a same second end that connects to the test module.

7. The apparatus of claim 1 wherein the data collector and controller determines if the armament circuit passes or fails the testing by comparing the test data to stored testing values.

8. The apparatus of claim 1 wherein the data collector and controller determines trending of the armament circuit by comparing the test data to historical test data for the same armament circuit and if the test results are within a predetermined range of test results provides prompts to a technician to take corrective action.

9. A method of testing an armament circuit, comprising the steps of:
   providing a connector that can electrically couple to the armament circuit and coupling a first end of the connector to the armament circuit;
   connecting a test module to a second end of the connector;
   establishing a wireless communications link between the test module and a handheld data collector and controller;
   climbing into a cockpit associated with the armament circuit and bringing the handheld data collector and controller into the cockpit;
   receiving instructions from a display on the handheld data collector and controller and exercising the armament circuit from within the cockpit, accordingly;
   sending an instruction from the handheld data collector and controller over the link to the test module to test the armament circuit;
   testing the armament circuit with the test module;
   providing results of the test to the data collector and controller over the link.

10. The method of claim 9, wherein the step of testing the armament circuit further comprises the step of de-energizing the armament circuit and testing for stray voltages.

11. The method of claim 9, wherein the step of testing the armament circuit further comprises the step of testing for the presence of voltage.

12. The method of claim 9, wherein the step of testing the armament circuit further comprises the step of testing for sufficient firing current.

13. The method of claim 9, wherein the step of testing the armament circuit further comprises the step of de-energizing the armament circuit and testing for continuity of the armament circuit.

14. The method of claim 9, further comprising the step of determining trending of the armament circuit by comparing the test data to historical test data from the same armament circuit and if the test results are within a predetermined range of test results then providing a prompt to a technician to take corrective action.

15. The method of claim 9, further comprising:
   testing a continuity across the connector between the testing module and the armament circuit.

* * * * *